US009103358B2

(12) United States Patent
Killian et al.

(10) Patent No.: US 9,103,358 B2
(45) Date of Patent: Aug. 11, 2015

(54) CORROSION-RESISTANT POSITION MEASUREMENT SYSTEM AND METHOD OF FORMING SAME

(75) Inventors: Michael Lee Killian, Troy, MI (US); Aquil Ahmad, Farmington Hills, MI (US); Clifton Baxter Higdon, Birmingham, MI (US); John Trublowski, Troy, MI (US)

(73) Assignee: Eaton Corporation, Cleveland, OH (US)

( * ) Notice: Subject to any disclaimer, the term of this patent is extended or adjusted under 35 U.S.C. 154(b) by 281 days.

(21) Appl. No.: 13/048,303

(22) Filed: Mar. 15, 2011

(65) Prior Publication Data

US 2011/0227590 A1 Sep. 22, 2011

Related U.S. Application Data

(60) Provisional application No. 61/314,248, filed on Mar. 16, 2010.

(51) Int. Cl.

*G01R 27/08* (2006.01)
*F15B 15/28* (2006.01)

(52) U.S. Cl.

CPC ......... *F15B 15/2846* (2013.01); *F15B 15/2861* (2013.01)

(58) Field of Classification Search

CPC ....... F01D 25/007; F16L 58/00; C23C 30/00; C23C 8/02
USPC ...................... 324/700, 754, 754.23; 228/165
See application file for complete search history.

(56) References Cited

U.S. PATENT DOCUMENTS

| | | | | |
|---|---|---|---|---|
| 4,348,263 A * | 9/1982 | Draper et al. | .................. | 205/50 |
| 5,493,097 A * | 2/1996 | Gustafsson et al. | ...... | 219/137 R |
| 5,884,388 A * | 3/1999 | Patrick et al. | ................ | 29/527.2 |
| 6,045,028 A * | 4/2000 | Martin et al. | .............. | 228/112.1 |
| 6,783,875 B2 * | 8/2004 | Yamada et al. | ............... | 428/697 |
| 7,384,696 B2 * | 6/2008 | Hayasaki et al. | ............. | 428/469 |

(Continued)

FOREIGN PATENT DOCUMENTS

| | | | |
|---|---|---|---|
| DE | 2855681 A1 * | 6/1980 | |
| DE | 102008062833 A1 | 6/2010 | |
| WO | 2010001228 A1 | 1/2010 | |

OTHER PUBLICATIONS

International Search Report and Written Opinion for International Application No. PCT/US2011/028611, mailed on Jul. 28, 2011.

*Primary Examiner* — Tung X Nguyen
*Assistant Examiner* — Giovanni Astacio-Oquendo
(74) *Attorney, Agent, or Firm* — Merchant & Gould P.C.

(57) ABSTRACT

A method of forming a position measurement system includes melting a surface of a substrate formed from a first material, wherein the surface defines at least one groove therein and wherein the surface is melted within the at least one groove. The method also includes, concurrent to melting, depositing a second material into the at least one groove to form a mixture of the first material and the second material. The method further includes solidifying the mixture to form an indicator material that is distinguishable from and metallurgically bonded to the first material, and depositing an alloy onto the substrate to form a corrosion-resistant cladding that covers the indicator material and the surface to thereby form the position measurement system. A position measurement system is also disclosed.

21 Claims, 2 Drawing Sheets

(56) References Cited

U.S. PATENT DOCUMENTS

| | | | | |
|---|---|---|---|---|
| 7,473,151 | B2 * | 1/2009 | Toyoda et al. | 445/24 |
| 8,308,051 | B2 * | 11/2012 | Hatakeyama et al. | 228/112.1 |
| 2003/0098336 | A1 * | 5/2003 | Yamashita | 228/112.1 |
| 2003/0111514 | A1 * | 6/2003 | Miyanagi et al. | 228/112.1 |
| 2003/0218858 | A1 * | 11/2003 | Kim et al. | 361/523 |
| 2004/0261746 | A1 * | 12/2004 | Narasimhan et al. | 123/188.3 |
| 2006/0231534 | A1 * | 10/2006 | Hill | 219/121.64 |
| 2006/0246701 | A1 * | 11/2006 | Huang | 438/609 |
| 2007/0214952 | A1 * | 9/2007 | Kossmann | 92/5 R |
| 2008/0226843 | A1 * | 9/2008 | Fukubayashi et al. | 427/597 |
| 2009/0174421 | A1 * | 7/2009 | Lee | 324/754 |
| 2009/0280349 | A1 * | 11/2009 | Bittendorfer et al. | 428/594 |
| 2010/0326969 | A1 * | 12/2010 | Tsukamoto et al. | 219/121.64 |
| 2011/0039126 | A1 * | 2/2011 | Kawai | 428/836 |

* cited by examiner

CORROSION-RESISTANT POSITION MEASUREMENT SYSTEM AND METHOD OF FORMING SAME

CROSS-REFERENCE TO RELATED APPLICATIONS

This application claims the benefit of U.S. Provisional Patent Application No. 61/314,248, filed on Mar. 16, 2010, which is hereby incorporated by reference in its entirety.

TECHNICAL FIELD

The present disclosure generally relates to position measurement systems and methods of forming position measurement systems.

BACKGROUND

Offshore drilling rigs often include direct-acting tensioners to compensate for wave-induced motion. More specifically, the direct-acting tensioners may include one or more massive hydraulic cylinders having a piston rod. The hydraulic cylinders continuously dampen wave-induced motion and thereby balance the drilling rig and/or stabilize the drill string. As such, dampening may be optimized by measuring, monitoring, and adjusting a position of the piston rod within the hydraulic cylinder. Moreover, the hydraulic cylinders are generally mounted below a deck of the drilling rig, i.e., in a splash zone, and are therefore often exposed to an extremely corrosive and wear-inducing environment from airborne salt spray, sea water, ice, moving cables, and/or debris. Consequently, the piston rods of such hydraulic cylinders must exhibit excellent corrosion-resistance and wear-resistance, and must remain crack-free over a service life.

Other types of piston rods and hydraulic cylinders may actuate large gate valves for applications including canals, locks, hydrodynamic power plants, foundries, and metal processing facilities. Actuation of the gate valves may be controlled by measuring and adjusting a position or displacement of the piston rods within the hydraulic cylinders. Further, the piston rods may undergo thousands of wear-inducing displacements and/or may experience impacts from moving machinery, components, and seals during operation of the hydraulic cylinders.

SUMMARY

A method of forming a position measurement system includes melting a surface of a substrate formed from a first material, wherein the surface defines at least one groove therein and wherein the surface is melted within the at least one groove. The method also includes, concurrent to melting, depositing a second material into the at least one groove to form a mixture of the first material and the second material. In addition, the method includes solidifying the mixture to form an indicator material that is distinguishable from and metallurgically bonded to the first material. The method also includes depositing an alloy onto the substrate to form a corrosion-resistant cladding that covers the indicator material and the surface to thereby form the position measurement system.

In one embodiment, the method includes machining a surface of a substrate to define a plurality of grooves therein. The substrate is formed from a first magnetic material and is a cylindrical rod having a longitudinal axis. Each of the plurality of grooves is spaced apart from an adjacent one of the plurality of grooves along the longitudinal axis, and the method includes melting the surface within each of the plurality of grooves to thereby distribute the plurality of grooves evenly along the longitudinal axis. Further, the method includes, concurrent to melting, depositing a second non-magnetic material within each of the plurality of grooves to thereby form a plurality of respective mixtures of the first magnetic material and the second non-magnetic material. The method also includes solidifying each of the plurality of respective mixtures to form a non-magnetic indicator material that is distinguishable from and metallurgically bonded to the first magnetic material. In addition, the method includes depositing a non-magnetic alloy onto the substrate to form a corrosion-resistant cladding that covers and is metallurgically bonded to each of the non-magnetic indicator material and the surface to thereby form the position measurement system.

A position measurement system includes a substrate formed from a first material and having a surface defining at least one groove therein. The position measurement system further includes an indicator material disposed within the at least one groove. The indicator material is formed from a mixture of the first material and the second material, and is distinguishable from and metallurgically bonded to the first material. In addition, the position measurement system includes a corrosion-resistant cladding formed from an alloy and disposed on the substrate so as to cover the indicator material and the surface.

The above features and other features and advantages of the present disclosure are readily apparent from the following detailed description of the best modes for carrying out the disclosure when taken in connection with the accompanying drawings.

DETAILED DESCRIPTION

Figure 1:
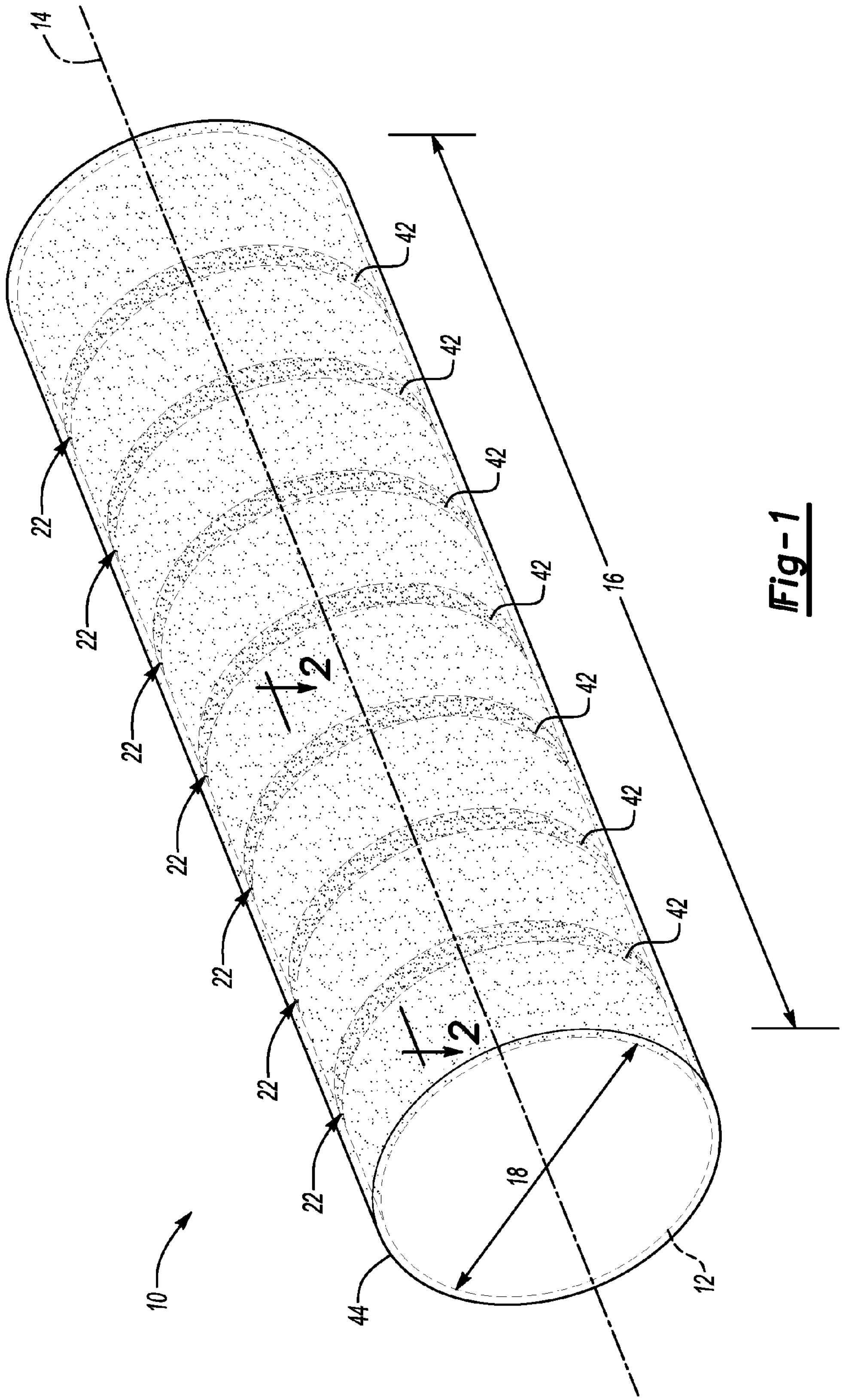
FIG. 1 is a schematic perspective illustration of a position measurement system.

Referring to the Figures, wherein like reference numerals refer to like elements, a method of forming a position measurement system 10 is described herein. The position measurement system 10 may be useful for detecting a position of a substrate 12 that operates in a corrosive environment. That is, the position measurement system 10 exhibits excellent corrosion-resistance, and the position measurement system 10 may be useful for determining a position or displacement of a substrate 12 with respect to a reference position. As such, the position measurement system 10 may be useful for marine applications, such as offshore drilling rigs, for indicating a position of the substrate 12, e.g., a piston rod, within a hydraulic cylinder. However, the position measurement system 10 may also be useful for non-marine applications requiring position measurement and corrosion-resistance including, but not limited to, canals, locks, hydrodynamic power plants, foundries, and metal processing facilities.

Referring to FIG. 1, the position measurement system 10 includes a substrate 12 formed from a first material. In one non-limiting example, the substrate 12 may be a cylindrical rod having a longitudinal axis 14, as shown in FIG. 1, such as a piston rod for a hydraulic cylinder (not shown). Further, the substrate 12 may have any suitable size according to a desired application. For example, for applications requiring the substrate 12 to translate into and out of a sealed cylinder or valve housing (not shown), the substrate 12 may have a length 16 of from about 1.5 meters to about 18 meters, and a diameter 18 of from about 120 mm to about 510 mm. As such, the substrate 12 may be characterized as an extra-large (XL) hydraulic cylinder piston rod.

The first material may be a metal. In addition, the first material may be ferrous. Therefore, the first material may be magnetic, and may have a first magnetic permeability. The first material may be selected from materials such as, but not limited to, steel, carbon steel, alloy steel, stainless steel, tool steel, cast iron, and combinations thereof. In one non-limiting example, the first material may be a heat-treated, low alloy, high strength steel such as SAE (Society of Automotive Engineers) 4130 steel or SAE 4340 steel. In another non-limiting example, the first material may be a plain carbon steel, such as SAE 1045 steel.

Figure 2:
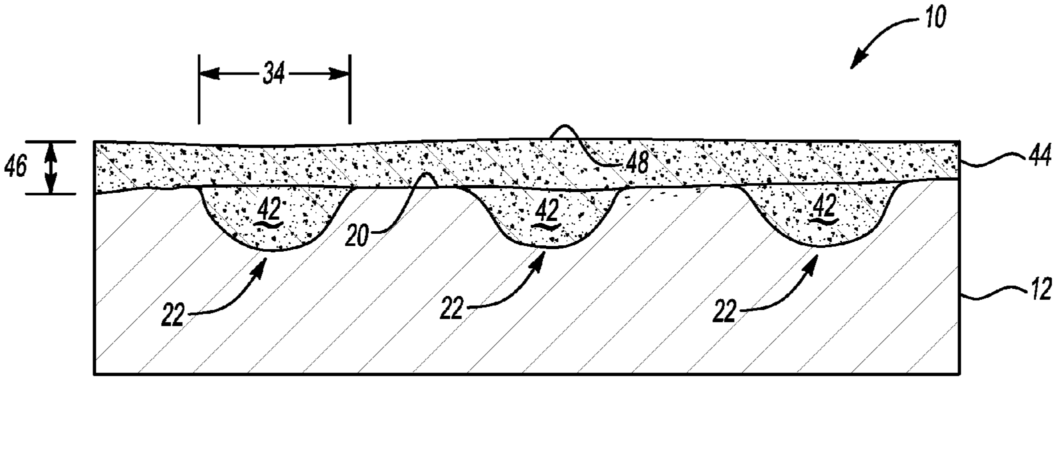
FIG. 2 is a schematic cross-sectional illustration of the position measurement system of FIG. 1 taken along section lines 2-2.
Figure 3:
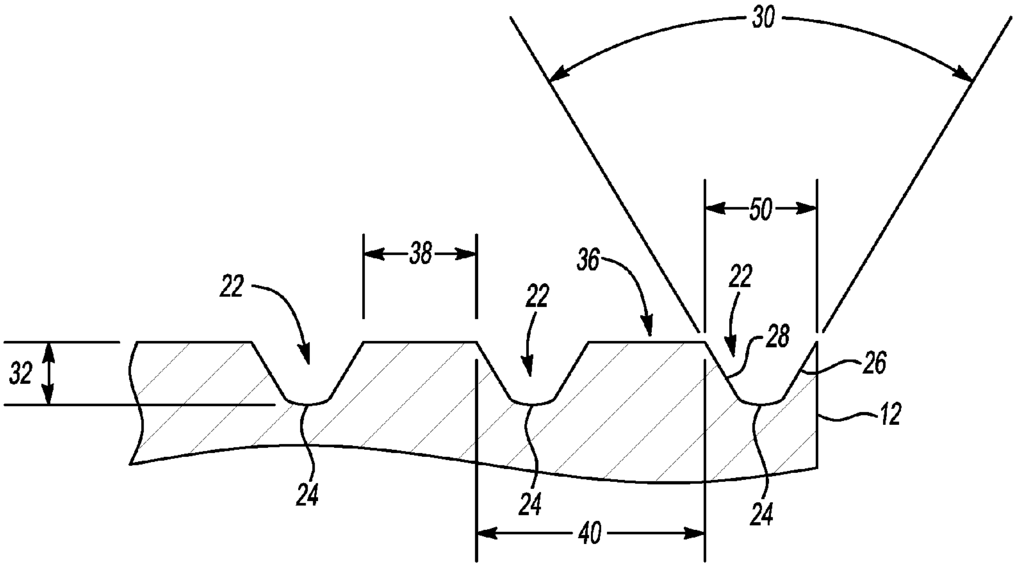
FIG. 3 is a schematic cross-sectional illustration of a plurality of grooves of the position measurement system of FIGS. 1 and 2.

Referring now to FIG. 2, the substrate 12 has a surface 20 defining at least one groove 22 therein. As shown in FIG. 3, the at least one groove 22 may have a V-shape and may define a substantially rounded vertex 24 having a radius of from about 0.3 mm to about 0.7 mm, e.g., about 0.5 mm. Therefore, each side 26, 28 of the at least one groove 22 may define an angle 30 therebetween of from about 55° to about 65°, e.g., about 60°. That is, each side 26, 28 of the at least one groove 22 may be sloped with respect to the surface 20. As such, rather than having a square shape (not shown) or a sharp vertex (not shown) which may concentrate stress during impact or wear-inducing events and cause cracking of the substrate 12, the groove 22 may have the substantially rounded vertex 24 configured to dissipate stress.

With continued reference to FIGS. 1 and 2, the surface 20 may define a plurality of grooves 22 therein. Each of the plurality of grooves 22 may extend from the surface 20 into the substrate 12 at a depth 32 (FIG. 3) of from about 0.09 mm to about 1.3 mm, e.g., about 1.1 mm, and may have a groove width 34 (FIG. 2) of from about 1.9 mm to about 2.1 mm, e.g., about 2.0 mm. Further, as best shown in FIG. 3, two adjacent grooves 22 may define a gap 36 therebetween having a gap width 38 of from about 1.9 mm to about 2.1 mm, e.g., about 2.0 mm, so that each of the plurality of grooves 22 is spaced apart from an adjacent one of the plurality of grooves 22 along the longitudinal axis 14 (FIG. 1). Therefore, the surface 20 may define the plurality of grooves 22 therein distributed evenly along the longitudinal axis 14 (FIG. 1). Stated differently, each gap 36 may be equidistantly spaced apart from an adjacent gap 36 by a groove 22 so that a ratio between the groove width 34 (FIG. 2) and the gap width 38 (FIG. 3) may be about 1:1. Therefore, the total width of one gap 36 and one groove 22 may be about 4.0 mm so that a period or pitch 40 of the position measurement system 10 may be about 4.0 mm. In addition, as shown in FIG. 1, each of the plurality of grooves 22 may be disposed substantially perpendicular to the longitudinal axis 14. That is, the surface 20 may define circumferential or radial grooves 22 in the substrate 12.

Referring again to FIG. 2, the position measurement system 10 also includes an indicator material 42 disposed within the at least one groove 22. The indicator material 42 may indicate a position of the substrate 12 during operation, as set forth in more detail below. The indicator material 42 is formed from a mixture of the first material and a second material.

More specifically, the second material may be a filler metal for a laser welding operation, as set forth in more detail below. Therefore, the second material may be non-magnetic and may be provided as a powder or wire for injection and melting by a laser (not shown). As such, the indicator material 42 may also be non-magnetic. In another non-limiting variation, the second material may be magnetic. For this variation, the indicator material 42 may also be magnetic and may have a second magnetic permeability that is different from the first magnetic permeability of the first material set forth above.

For embodiments where the first material is low alloy, high strength steel or plain carbon steel, the second material may be an alloy including an element selected from the group of nickel, cobalt, and combinations thereof. Nickel and/or cobalt may be present in the second material to provide corrosion-resistance to the indicator material 42. More specifically, nickel and/or cobalt may be present in the second material in an amount of from about 1 part to about 90 parts by weight based on 100 parts by weight of the second material. For example, a suitable second material for providing the indicator material 42 with excellent corrosion-resistance may include about 65 parts by weight nickel, about 20 parts by weight chromium, about 8 parts by weight molybdenum, about 3.5 parts by weight of a combination of niobium and tantalum, and about 4.5 parts by weight of iron based on 100 parts by weight of the metal alloy, and may be commercially available under the trade name INCONEL® 625 from Special Metals Corporation of New Hartford, N.Y. Likewise, a suitable second material may include about 54 parts by weight cobalt, about 26 parts by weight chromium, about 9 parts by weight nickel, about 5 parts by weight molybdenum, about 3 parts by weight iron, about 2 parts by weight tungsten, and about 1 part by weight of a combination of manganese, silicon, nitrogen, and carbon, and may be commercially available under the trade name ULTIMET® from Haynes International, Inc. of Kokomo, Ind. Further, other suitable non-limiting examples of second materials may include alloys commercially available under the trade names Micro-Melt® CCW alloy from Carpenter Technology Corporation of Reading, Pa., Stellite® 21 from Stellite Coatings of Goshen, Ind., and Eatonite™ ABC-L1 from Eaton Corporation of Cleveland, Ohio.

Alternatively, the second material may be a stainless steel. Suitable stainless steels include, but are not limited to, 308-, 316-, 321-, and 347-grade austenitic stainless steels. For some applications requiring excellent corrosion-resistance over a comparatively shorter service life, e.g., less than about 15 years, or under comparatively less-corrosive operating environments, e.g., brackish water, suitable second materials may alternatively include martensitic stainless steels, ferritic stainless steels, super ferritic stainless steels, duplex stainless steels, super duplex stainless steels, and combinations thereof.

Referring again to FIG. 2, the indicator material 42 is distinguishable from the first material. For example, since the indicator material 42 may be non-magnetic and the first material may be magnetic, the indicator material 42 may be distinguishable, i.e., able to be sensed or detected, by a sensor (not shown), such as a Hall effect sensor or transducer that is configured for varying output voltage in response to changes in a magnetic field. In another non-limiting example, the indicator material 42 may be distinguishable from the first material based on differences between the second magnetic permeability of the indicator material 42 and the first magnetic permeability of the first material. For example, each of the indicator material 42 and the first material may be magnetic, but the indicator material 42 may have the second magnetic permeability that is different from the first magnetic permeability of the first material. Therefore, the sensor may respond to the difference between the second magnetic permeability and the first magnetic permeability of the indicator material 42 and the first material, respectively. In yet another non-limiting example, the indicator material 42 may be distinguishable from the first material based on another property, such as density.

The indicator material 42 is also metallurgically bonded to the first material. For example, the indicator material 42 may be weld bonded to the first material. That is, since the indicator material 42 is formed from a mixture of the first material and the second material, e.g., after melting, the indicator material 42 is metallurgically bonded to the first material, as set forth in more detail below.

With continued reference to FIG. 2, the position measurement system 10 also includes a corrosion-resistant cladding 44 formed from an alloy and disposed on the substrate 12 so as to cover the indicator material 42 and the surface 20. The corrosion-resistant cladding 44 may provide the position measurement system 10 with excellent corrosion- and wear-resistance, as set forth in more detail below.

The alloy of the corrosion-resistant cladding 44 may be a metal alloy for a laser cladding operation. Therefore, the alloy may be provided as a powder or wire for injection and melting by a laser (not shown). In addition, the alloy and the corrosion-resistant cladding 44 may be non-magnetic. Alternatively, the alloy and the corrosion-resistant cladding 44 may be magnetic, but may have a magnetic permeability that is different from the first magnetic permeability of the first material set forth above.

The alloy of the corrosion-resistant cladding 44 may be similar to the second material. For example, for applications where the second material is INCONEL® 625, the alloy of the corrosion-resistant cladding 44 may also be INCONEL® 625. Likewise, for applications where the second material is 316-grade stainless steel, the alloy of the corrosion-resistant cladding 44 may also be 316-grade stainless steel. Alternatively, the second material and the alloy of the corrosion-resistant cladding 44 may be dissimilar. For example, according to cost or weight considerations, the second material may be 316-grade stainless steel, and the alloy of the corrosion-resistant cladding 44 may be INCONEL® 625.

For embodiments where the first material is low alloy, high strength steel or plain carbon steel, the alloy of the corrosion-resistant cladding 44 may include an element selected from the group of nickel, cobalt, and combinations thereof. Nickel and/or cobalt may be present in the alloy to provide corrosion-resistance to the position measurement system 10. More specifically, nickel and/or cobalt may be present in the alloy in an amount of from about 1 part to about 90 parts by weight based on 100 parts by weight of the alloy. For example, a suitable alloy of the corrosion-resistant cladding 44 may include about 65 parts by weight nickel, about 20 parts by weight chromium, about 8 parts by weight molybdenum, about 3.5 parts by weight of a combination of niobium and tantalum, and about 4.5 parts by weight of iron based on 100 parts by weight of the alloy, and may be commercially available under the trade name INCONEL® 625 from Special Metals Corporation of New Hartford, N.Y. Likewise, a suitable alloy of the corrosion-resistant cladding 44 may include about 54 parts by weight cobalt, about 26 parts by weight chromium, about 9 parts by weight nickel, about 5 parts by weight molybdenum, about 3 parts by weight iron, about 2 parts by weight tungsten, and about 1 part by weight of a combination of manganese, silicon, nitrogen, and carbon, and may be commercially available under the trade name ULTIMET® from Haynes International, Inc. of Kokomo, Ind. Further, other suitable non-limiting examples of alloys may be commercially available under the trade names Micro-Melt® CCW alloy from Carpenter Technology Corporation of Reading, Pa., Stellite® 21 from Stellite Coatings of Goshen, Ind., and Eatonite™ ABC-L1 from Eaton Corporation of Cleveland, Ohio.

Alternatively, the alloy of the corrosion-resistant cladding 44 may be a stainless steel. Suitable stainless steels include, but are not limited to, 308-, 316-, 321-, and 347-grade austenitic stainless steels. For some applications, suitable alloys may alternatively include martensitic stainless steels, ferritic stainless steels, super ferritic stainless steels, duplex stainless steels, super duplex stainless steels, and combinations thereof.

Since the alloy of the corrosion-resistant cladding 44 may include nickel and/or cobalt, the corrosion-resistant cladding 44 exhibits excellent corrosion-resistance. More specifically, the corrosion-resistant cladding 44 may be substantially resistant to corrosion from sea water at an ambient temperature of from about −40° C. to about 50° C. Stated differently, the corrosion-resistant cladding 44 minimizes oxidation of the surface 20 of the substrate 12 in air after exposure to sea water. As used herein, in contrast to fresh water, the terminology "sea water" refers to water having a salinity of from about 31 parts by volume to about 40 parts by volume based on 1 trillion parts by volume of sea water, i.e., about 31 ppt to about 40 ppt (about 3.1% to about 4%), and a density of about 1.025 g/ml at 4° C. Further, sea water includes dissolved salts of one or more ions selected from the group including chloride, sodium, sulfate, magnesium, calcium, potassium, bicarbonate, bromide, borate, strontium, fluoride, and combinations thereof. Sea water may include brackish, saline water, and brine.

Additionally, the corrosion-resistant cladding 44 may exhibit a free corrosion potential, $E_{corr}$, of less than or equal to −0.200. As used herein, the terminology "free corrosion potential" refers to an absence of net electrical current flowing to or from the substrate 12 in sea water relative to a reference electrode. Further, the corrosion-resistant cladding 44 may exhibit a corrosion rate of less than or equal to about 0.000254 mm per year. As used herein, the terminology "corrosion rate" refers to a change in the substrate 12 and/or corrosion-resistant cladding 44 caused by corrosion per unit of time and is expressed as an increase in corrosion depth per year. Therefore, the corrosion-resistant cladding 44 may exhibit minimized susceptibility to localized corrosion from, for example, pitting and/or crack propagation.

As shown in FIG. 2, the corrosion-resistant cladding 44 may have a thickness 46 of from about 0.6 mm to about 1.6 mm, e.g., about 1.3 mm. Further, the corrosion-resistant cladding 44 may define an external surface 48 thereof that is substantially smooth. That is, the external surface 48 may have a surface roughness, $R_a$, of from about 0.1 microns to about 0.15 microns, where 1 micron is equal to $1\times10^{-6}$ meters. As used herein, the terminology "surface roughness, $R_a$" refers to a measure of a texture of the external surface 48 of the corrosion-resistant cladding 44 and refers to an average distance between peaks and valleys (not shown) of the external surface 48. More specifically, microscopic valleys on the external surface 48 of the corrosion-resistant cladding 44 correspond to a point on the external surface 48 that lies below an average line. Similarly, microscopic peaks on the external surface 48 of the corrosion-resistant cladding 44 correspond to a point on the external surface 48 that lies above an average line. Thus, measurements of distances between such peaks and valleys determine the surface roughness, $R_a$. The surface roughness, $R_a$, of the external surface 48 may be provided by polishing or finishing the corrosion-resistant cladding 44, as set forth in more detail below.

Comparatively rougher surfaces generally exhibit less wear-resistance and wear more quickly as compared to relatively smoother surfaces, since irregularities such as peaks and valleys in surfaces may form initiation sites for cracks, stress zones, and/or corrosion. Therefore, since the external surface 48 is substantially smooth, the corrosion-resistant cladding 44 exhibits excellent smoothness and resulting wear- and corrosion-resistance.

Referring again to FIG. 2, the corrosion-resistant cladding 44 covers the indicator material 42 and the surface 20 of the substrate 12. More specifically, the corrosion-resistant cladding 44 may be metallurgically bonded to each of the indicator material 42 and the surface 20 at a bond strength of greater than about 70 MPa, e.g., greater than about 340 MPa, as measured in accordance with the ASTM Multistep Shear Test for Bond Strength of Claddings. The aforementioned bond strength minimizes delamination of the corrosion-resistant cladding 44 and may be especially advantageous for applications requiring materials with minimized thermal expansion upon repeated heating and cooling, e.g., from exposure to direct sunlight.

Referring now to the method, the method of forming the position measurement system 10 is described with general reference to FIGS. 1-3. The method includes melting the surface 20 of the substrate 12 formed from the first material, wherein the surface 20 defines at least one groove 22 therein and wherein the surface 20 is melted within the at least one groove 22. That is, the surface 20 is melted within the at least one groove 22, i.e., at the location of the at least one groove 22. The surface 20 within the at least one groove 22, e.g., the plurality of grooves 22, may be melted by any known process. For example, the surface 20 within the at least one groove 22 may be melted by laser welding the surface 20 defining the at least one groove 22 with a laser (not shown) having a spot size of about 2 mm.

Therefore, prior to melting, the method may include machining the surface 20 to define the plurality of grooves 22 therein, wherein each of the plurality of grooves 22 is disposed substantially perpendicular to the longitudinal axis 14 (FIG. 1) and spaced apart from an adjacent one of the plurality of grooves 22 along the longitudinal axis 14. The substrate 12 may be straightened and cleaned to prepare the substrate 12 for machining. The surface 20 of the substrate 12 may then be machined, e.g., with a lathe or cutting tool having a plurality of cutting inserts (not shown), to define the plurality of grooves 22. Four, six, or more grooves 22 may be machined into the surface 20 simultaneously. Referring to FIG. 3, the plurality of grooves 22 may result from machining the substrate 12, and may extend into the substrate at the depth 32 set forth above, e.g., about 1.10 mm. As shown in FIG. 3, a machined width 50 of the groove 22 may be less than the final groove width 34 of the groove 22 after melting. That is, the machined width 50 of the groove 22 may be from about 1.8 mm to about 2.0 mm, e.g., about 1.9 mm, to allow for slight expansion of the groove 22 during melting.

Referring again to FIG. 2, the method also includes, concurrent to melting, depositing the second material into the at least one groove 22 to form the mixture of the first material and the second material. That is, melting and concurrent depositing may be further defined as laser welding the surface 20 at the at least one groove 22 so that the surface 20 within the at least one groove 22 melts as the second material is deposited. Stated differently, the second material and the surface 20 defining the at least one groove 22 may be laser welded, i.e., fusion welded, so that a portion of the at least one groove 22 melts and mixes with the second material to form the mixture. For example, the second material in the form of powder or wire may be injected into the melting groove 22 to form the mixture of the first material and the second material. Laser welding may form a liquefied weld puddle within each groove 22, wherein the weld puddle is formed from the mixture of the first material and the second material. A composition of the mixture may therefore be controlled by varying an amount of the first material that is melted and an amount of second material deposited or injected into the at least one groove 22.

Laser welding, i.e., melting the surface 20 of the at least one groove 22 and concurrently depositing the second material into the at least one groove 22, may be carried out by a laser welding device (not shown) including a laser emitted from a welding head. The laser welding device may also include a laser-structured light seam tracker apparatus attached to the welding head to enable accurate, automatic positioning of the welding head over the plurality of grooves 22. Such an apparatus may minimize machining and positioning errors during machining.

The shape of the at least one groove 22 may minimize shrinkage cracking and porosity of the mixture. As used herein, the terminology porosity refers to an amount of void space within a material and is expressed as a percentage of the total material. In addition, the at least one groove 22 minimizes an amount of the first material that melts during laser welding, which in turn minimizes an amount of iron in the resulting mixture of the first material and the second material. Such minimized iron content of the mixture increases the corrosion-resistance of the position measurement system 10.

Referring again to FIG. 2, the method further includes solidifying the mixture to form the indicator material 42 that is distinguishable from and metallurgically bonded to the first material. That is, the mixture may harden after completion of laser welding so as to solidify and form the indicator material 42 or laser weld. Since the indicator material 42 is formed by solidifying the mixture of the first material and the second material, the indicator material 42 is fusion welded to the first material of the substrate 12. The aforementioned melting, concurrent depositing, and solidifying of the mixture forms the indicator material 42 having excellent bond strength and minimized porosity. That is, the bond strength of the indicator material 42 may be significantly greater than a bond strength of a comparative material (not shown) formed by brazing, soldering, electroplating, and/or thermal spraying that may exhibit a bond strength of from only about 13 MPa to about 69 MPa. The increased bond strength of the indicator material 42 may be especially advantageous for applications requiring materials with minimized thermal expansion upon repeated heating and cooling, e.g., from exposure to direct sunlight.

With continued reference to FIG. 2, the method also includes depositing the alloy onto the substrate 12 to form the corrosion-resistant cladding 44 that covers the indicator material 42 and the surface 20 to thereby form the position measurement system 10. That is, depositing the alloy may be further defined as laser cladding the indicator material 42 and the surface 20 so that each of the indicator material 42 and the surface 20 melts and metallurgically bonds to the corrosion-resistant cladding 44. Stated differently, the corrosion-resistant cladding 44 may be laser clad, i.e., fusion welded to, the indicator material 42 and the surface 20 so that a portion of the indicator material 42 and the surface 20 melts and mixes with the alloy to form the corrosion-resistant cladding 44. Laser cladding may therefore fuse the alloy with each of the substrate 12 and the indicator material 42 to form the corrosion-resistant cladding 44 on the substrate 12.

Laser cladding, i.e., depositing the alloy onto the substrate to form the corrosion-resistant cladding 44, may be carried out by a laser cladding system (not shown) including a laser emitted from a welding head. The corrosion-resistant cladding 44 may be deposited onto the surface 20 and the indicator material 42 in a tightly spiraling path along the longitudinal axis 14. For example, the substrate 12 may be rotated while the laser cladding system deposits the corrosion-resistant cladding 44 onto the surface 20 and the indicator material 42 in the tightly spiraling path.

The corrosion-resistant cladding 44 may be deposited directly onto the indicator material 42 so as to cover the indicator material 42. Therefore, the method does not require intermediate grinding or machining of the indicator material 42 before deposition of the alloy to form the corrosion-resistant cladding 44. The alloy may be deposited so that the corrosion-resistant cladding 44 is a single layer having a preliminary thickness (not shown) of from about 1.7 mm to about 2.0 mm, e.g., about 1.8 mm to about 1.9 mm. Subsequently, the corrosion-resistant cladding 44 may be ground to the thickness 46 (FIG. 2) of from about 0.6 mm to about 1.6 mm, e.g., about 1.3 mm.

It is to be appreciated that the alloy may be deposited onto the substrate 12 after melting, concurrently depositing the second material, and solidifying the mixture as set forth above. Alternatively, the method may include concurrently melting, depositing the second material, and depositing the alloy. That is, melting, depositing the second material, and depositing the alloy may be concurrent. More specifically, the second material and the alloy may be of the same composition, i.e., may be the same material, so that the second material may be deposited into the at least one groove 22 as the alloy is deposited onto the substrate 12 to form the corrosion-resistant cladding 44.

The method may further include finishing the corrosion-resistant cladding 44 to define the external surface 48 that is substantially smooth. For example, the corrosion-resistant cladding 44 may be machined, ground, and/or polished so that the external surface 48 has the surface roughness, $R_a$, of from about 0.1 microns to about 0.15 microns.

The method may also include increasing the bond strength between the corrosion-resistant cladding 44 and each of the indicator material 42 and the first material. That is, since the corrosion-resistant cladding 44 is formed from the alloy deposited via laser cladding, the corrosion-resistant cladding 44 exhibits excellent bond strength as set forth above.

In another embodiment, as described with reference to FIG. 1, the method of forming the position measurement system 10 includes machining the surface 20 of the substrate 12 to define the plurality of grooves 22 therein, wherein the substrate 12 is formed from the first magnetic material and is a cylindrical rod having the longitudinal axis 14. Each of the plurality of grooves 22 is spaced apart from one another along the longitudinal axis 14.

For this embodiment, the method also includes melting the surface 20 within each of the plurality of grooves 22 to thereby distribute the plurality of grooves 22 evenly along the longitudinal axis 14. That is, the surface 20 of each of the plurality of grooves 22 may melt and thereby expand from the machined width 50 to the groove width 34 to space each groove 22 apart from an adjacent groove 22 and define the gap 36 therebetween. Therefore, melting may distribute the plurality of grooves 22 evenly along the longitudinal axis 14 so that the ratio of the groove width 34 to the gap width 38 is about 1:1.

Concurrent to melting, the method includes depositing the second non-magnetic material within each of the plurality of grooves 22 to thereby form the plurality of respective mixtures of the first magnetic material and the second non-magnetic material. The method also includes solidifying the plurality of respective mixtures to form the non-magnetic indicator material 42 that is distinguishable from and metallurgically bonded to the first magnetic material. The method additionally includes depositing the non-metallic alloy onto the substrate 12 to form the corrosion-resistant cladding 44 that covers and is metallurgically bonded to each of the non-magnetic indicator material 42 and the surface 20 to thereby form the position measurement system 10. It is to be appreciated that melting, depositing the second non-magnetic material, and depositing the non-magnetic alloy may be concurrent. The method may further include increasing the bond strength between the corrosion-resistant cladding 44 and each of the non-magnetic indicator material 42 and the first magnetic material.

In operation, the position measurement system 10 may interact with one or more sensors (not shown), e.g., one or more Hall effect sensors or magneto-resistance sensors, to indicate the position of the substrate 12 with respect to a reference position. For example, the sensors may continuously interrogate the position measurement system 10 and detect the indicator material 42 disposed beneath the corrosion-resistant cladding 44. In particular, as the position measurement system 10 translates past the sensors, e.g., extends or retracts within a hydraulic cylinder, the sensors may detect a change in the magnetic field due to the presence of the alternating magnetic first material and non-magnetic indicator material 42, and a displacement of the position measurement system 10 with respect to a reference position may be calculated. As the position measurement system 10 changes position, the sensors may detect a position of the substrate 12 to an accuracy of about 1 mm. If desired, the sensors may also include a pulse multiplier transducer (not shown) to increase the sensitivity of the sensors. For example, in combination, the sensors and the pulse multiplier transducer may detect a position of the substrate 12 to an accuracy of about 0.1 mm. For redundancy during operation, the position measurement system 10 may interact with at least two sensors and two pulse multiplier transducers.

The aforementioned position measurement system 10 formed by the method as described herein exhibits excellent corrosion-resistance as compared to other systems (not shown) that include electroplated coatings such as nickel-chromium coatings; thermally-sprayed ceramic coatings such as chromia-titania coatings and alumina-titania coatings; high velocity oxy-fuel gas (HVOF) thermally-sprayed ceramic coatings including hard particles such as tungsten carbide, chromium carbide, oxides, and combinations thereof disposed in a cobalt, nickel-chromium, or nickel binder phase; and plasma-sprayed coatings. Therefore, the position measurement system 10 may be especially suitable for applications requiring continuous corrosion-resistance over an extended service life, e.g., about 15 years or more, such as piston rods for hydraulic cylinders in service within a saltwater splash zone of an offshore drilling rig.

In addition, the corrosion-resistant cladding 44 and indicator material 42 each exhibit minimized porosity. For example, the corrosion-resistant cladding 44 may have a porosity of about 0.03 percent, which may contribute to reduced cracking and increase corrosion-resistance. That is, the aforementioned porosity minimizes formation of interconnected paths within the corrosion-resistant cladding 44. Such interconnected paths may allow ingress of corrosive elements and compromise the corrosion-resistance of the position measurement system 10. In contrast, HVOF coatings may have a porosity of from about 0.5 percent to about 2.0 percent, and plasma sprayed ceramic coatings may have a porosity of from about 3.0 percent to about 10 percent, and may therefore exhibit reduced corrosion-resistance and spalling.

Further, the corrosion-resistant cladding 44 of the position measurement system 10 may be ductile. Therefore, the corrosion-resistant cladding 44 may remain crack-free upon comparatively high-energy impacts. In contrast, HVOF coatings and plasma sprayed coatings are generally brittle and may crack severely upon comparatively low-energy impacts.

The position measurement systems 10 and related methods provide corrosion-resistant claddings 44 having excellent hardness and corrosion-resistance. Therefore, the position measurement systems 10 are suitable for exposure to sea water, e.g., for applications requiring coated metal substrates 12 for operation within a splash-zone of an offshore drilling rig. The corrosion-resistant claddings 44 are smooth and exhibit excellent compressive residual stress. Therefore, the position measurement systems 10 exhibit improved fatigue life and resistance to tensile stress, and reduced infiltration and propagation of fatigue cracks, shrink cracks, and other flaws. Further, the methods are cost-effective, and minimize discontinuities in the corrosion-resistant claddings 44 and indicator material 42 such as cracks and/or pores.

While the best modes for carrying out the disclosure have been described in detail, those familiar with the art to which this disclosure relates will recognize various alternative designs and embodiments for practicing the disclosure within the scope of the appended claims.

The invention claimed is:

1. A method of forming a position measurement system, the method comprising:

machining a plurality of grooves in a surface of a shaft formed from a first material, the shaft defining an axis and having a shaft length that extends along the axis, the grooves having groove lengths that extend circumferentially about the axis, each of the plurality of grooves being axially spaced apart from an adjacent one of the plurality of grooves by one of a plurality of lands, wherein each groove has a substantially V-shape, a rounded vertex having a radius of from about 0.3 mm to about 0.7 mm, and two sides that define an angle therebetween of from about 55° to about 65°, the grooves having depths defined at the rounded vertexes, and the depths of the grooves being equal to one another;

laser welding a second material into only the plurality of grooves of the surface of the shaft, wherein the laser welding melts the surface within the plurality of grooves to form a mixture of the first material and the second material in only the plurality of grooves;

solidifying the mixture to form an indicator material that is distinguishable from the first material and metallurgically bonded in the plurality of grooves to the first material, wherein the indicator material is present in the grooves and is not present over the lands such that the indicator material is alternatingly present and not present along the shaft length of the shaft; and depositing an alloy onto the shaft to form a corrosion-resistant cladding that covers the indicator material and the plurality of lands of the shaft to thereby form the position measurement system.

2. The method of claim 1, wherein the substrate has a longitudinal axis, and the plurality of grooves is disposed evenly along the longitudinal axis.

3. The method of claim 2, wherein a bond strength between the corrosion-resistant cladding and each of the indicator material and the first material is greater than or equal to 340 MPa.

4. The method of claim 1, further including finishing the corrosion-resistant cladding to define an external surface thereof, wherein the external surface is substantially smooth.

5. A method of forming a position measurement system, the method comprising:

machining a surface of a cylindrical rod to define a plurality of grooves therein each having a substantially V-shape, the surface including a land disposed between adjacent grooves of the plurality of grooves, wherein the cylindrical rod is formed from a first material, the first material being magnetic;

laser welding a second material into only the plurality of grooves of the surface of the cylindrical rod, the second material being non-magnetic, wherein a non-magnetic indicator mixture of the first material and the second material is formed in each of the plurality of grooves; and depositing a non-magnetic alloy onto the cylindrical rod to form a corrosion-resistant cladding that covers and is metallurgically bonded to each of the non-magnetic indicator material and the lands of the surface.

6. The method of claim 5, wherein a bond strength between the corrosion-resistant cladding and each of the non-magnetic indicator material and the first material is greater than or equal to 340 MPa.

7. The method of claim 5, wherein each of the plurality of grooves extends from the surface into the cylindrical rod at a depth of from about 0.09 mm to about 1.3 mm.

8. The method of claim 7, wherein each of the plurality of grooves has a groove width of from about 1.9 mm to about 2.1 mm, and wherein the land has a width of from about 1.9 mm to about 2.1 mm.

9. A position measurement system for a hydraulic cylinder comprising:

a piston rod formed from a substrate material, the piston rod including a surface defining a plurality of grooves with each of the plurality of grooves being spaced apart from an adjacent one of the plurality of grooves by a land, wherein each of the plurality of grooves is substantially V-shaped;

an indicator material disposed in only the plurality of grooves of the surface, wherein the indicator material is different than the substrate material of the piston rod; and a cladding disposed on the substrate so as to cover the indicator material and each land disposed between each of the plurality of grooves and the adjacent of the surface, wherein the cladding is metallurgically bonded directly to the indicator material and the lands of the surface.

10. The position measurement system of claim 9, wherein the cladding is metallurgically bonded to each of the indicator material and the surface at a bond strength of greater than about 340 MPa.

11. The position measurement system of claim 9, wherein the first material is magnetic and each of the corrosion-resistant cladding and the indicator material is non-magnetic.

12. The position measurement system of claim 9, wherein the plurality of grooves is distributed evenly along a longitudinal axis of the piston rod.

13. The position measurement system of claim 12, wherein each of the plurality of grooves extends from the surface into the piston rod at a depth of from about 0.09 mm to about 1.3 mm and each of the plurality of grooves has a groove width of from about 1.9 mm to about 2.1 mm, and wherein the land disposed between two adjacent grooves has a width of from about 1.9 mm to about 2.1 mm.

14. The position measurement system of claim 9, wherein the piston rod has a rod length that extends along an axis of the piston rod, and wherein the grooves are axially spaced-apart from one another along the rod length of the piston rod.

15. The position measurement system of claim 14, wherein the grooves have groove lengths that extend circumferentially about the axis of the piston rod and groove widths that extend axially along the axis of the piston rod, the groove lengths being longer than the groove widths.

16. The position measurement system of claim 15, wherein the lands are wider than the grooves when measured in a direction that extends along the axis of the piston rod.

17. The position measurement system of claim 9, wherein the lands form flat plateaus between the grooves when viewed in cross-section.

18. A method of forming a position measurement system, the method comprising:

machining a plurality of grooves in a surface of a shaft formed from a first material, the shaft defining an axis and having a shaft length that extends along the axis, the grooves having groove lengths that extend circumferentially about the axis, each of the plurality of grooves being axially spaced apart from an adjacent one of the plurality of grooves by one of a plurality of lands;

laser welding a second material only into the plurality of grooves of the surface of the shaft wherein the laser welding melts the surface within the plurality of grooves to form a mixture of the first material and the second material in only the plurality of grooves; and solidifying the mixture to form an indicator material that is magnetically distinguishable from the first material and metallurgically bonded in the plurality of grooves to the first material, wherein the indicator material is present in the grooves and is not present over the lands such that the indicator material is alternatingly present and not present along the shaft length of the shaft.

19. The method of claim 18, wherein the indicator material is non-magnetic or at least leas magnetic than the first material.

20. The method of claim 18, further comprising depositing an alloy onto the shaft to form a corrosion-resistant cladding that covers and directly contacts the indicator material present in the grooves and also covers and directly contacts the first material of the shaft at the plurality of lands of the shaft.

21. The method of claim 20, wherein the alloy is non-magnetic.

* * * * *